(12) United States Patent
Aritomi et al.

(10) Patent No.: US 9,431,611 B2
(45) Date of Patent: Aug. 30, 2016

(54) PRODUCTION METHOD FOR ORGANIC ELECTROLUMINESCENT ELEMENT

(71) Applicant: Konica Minolta Inc., Tokyo (JP)

(72) Inventors: Yuuji Aritomi, Hachioji (JP); Kuniaki Uezawa, Hamura (TW)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/783,363

(22) PCT Filed: Apr. 7, 2014

(86) PCT No.: PCT/JP2014/060053
§ 371 (c)(1),
(2) Date: Oct. 8, 2015

(87) PCT Pub. No.: WO2014/168102
PCT Pub. Date: Oct. 16, 2014

(65) Prior Publication Data
US 2016/0072067 A1    Mar. 10, 2016

(30) Foreign Application Priority Data

Apr. 11, 2013 (JP) ................. 2013-082816

(51) Int. Cl.
| | |
|---|---|
| H01L 21/00 | (2006.01) |
| H01L 51/00 | (2006.01) |
| H01L 51/50 | (2006.01) |
| H01L 51/56 | (2006.01) |
| H01L 51/52 | (2006.01) |

(52) U.S. Cl.
CPC ....... *H01L 51/0015* (2013.01); *H01L 51/0026* (2013.01); *H01L 51/5012* (2013.01); *H01L 51/56* (2013.01); *H01L 51/5212* (2013.01); *H01L 51/5253* (2013.01); *H01L 2251/5323* (2013.01); *H01L 2251/5338* (2013.01)

(58) Field of Classification Search
CPC .................................................. H01L 51/0015
USPC .......................................................... 438/26
See application file for complete search history.

(56) References Cited

U.S. PATENT DOCUMENTS

| | | |
|---|---|---|
| 2005/0130548 A1 | 6/2005 | Kubota |
| 2005/0236975 A1 | 10/2005 | Addington et al. |
| 2012/0091877 A1 | 4/2012 | Verschuren |

FOREIGN PATENT DOCUMENTS

| | | |
|---|---|---|
| JP | 2793373 A | 9/1998 |
| JP | 2001167881 A | 6/2001 |
| JP | 2005183045 A | 7/2005 |
| JP | 2005310771 A | 11/2005 |
| JP | 2012523078 A | 9/2012 |
| WO | 2012086349 A1 | 6/2012 |

OTHER PUBLICATIONS

International Search Report dated Jun. 10, 2014 for PCT/JP2014/060053 and English translation.

*Primary Examiner* — Anthony Ho

(57) ABSTRACT

The present invention aims at providing a method for producing an organic electroluminescent element, by which a non-light-emitting region can be formed without any accompanying discoloration of a resin substrate. The method for producing an organic electroluminescent element includes a stacking step, in which a first electrode, an organic functional layer and a second electrode are formed by stacking on a resin substrate, and a light irradiation step, in which a prescribed region of the organic functional layer is irradiated with light being free from wavelength components at 340 nm or less.

2 Claims, 1 Drawing Sheet

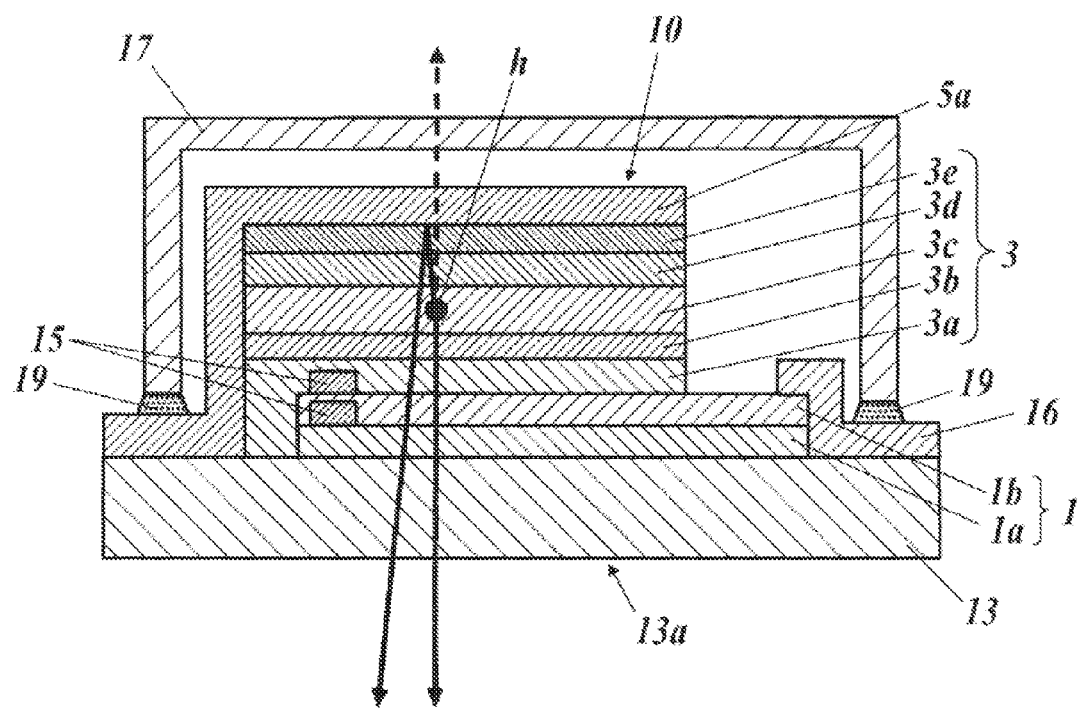

PRODUCTION METHOD FOR ORGANIC ELECTROLUMINESCENT ELEMENT

CROSS REFERENCE TO RELATED APPLICATION

This Application is a 371 of PCT/JP2014/060053 filed on Apr. 7, 2014 which, in turn, claimed the priority of Japanese Patent Application No. JP2013-082816 filed on Apr. 11, 2013, both applications are incorporated herein by reference.

TECHNICAL FIELD

The present invention relates to a method for producing an organic electroluminescent element. Especially, the present invention relates to a method for producing an organic electroluminescent element in which an organic functional layer is stacked on a resin substrate, by which a non-light-emitting region can be formed without any accompanying discoloration of a resin substrate.

BACKGROUND ART

Currently, organic light emitting elements gain attention as thin light emitting materials.

Organic light emitting elements utilizing the electroluminescence (Electro Luminescence: EL) of organic materials (so-called organic EL elements) are thin-film type complete solid elements that can emit light at low voltages of from about several volts to several tens of volts, and have many excellent features such as high luminance, highlight emitting efficiency, thin type and light weight. Therefore, organic light emitting elements have gained attention in recent years as backlights for various displays, display plates such as signboards and emergency lights, and surface light emitters such as illumination light sources.

Such organic EL elements each has a constitution in which a light emitting layer formed of an organic material is disposed between two electrodes, and the emitted light that has been generated in the light emitting layer passes through the electrodes and is extracted outside. Therefore, at least one of the two electrodes is constituted as a transparent electrode, and the emitted light is extracted from the side of the transparent electrode. Furthermore, the organic EL elements can give a high luminance at a low electrical power, and thus are excellent in visibility, response velocity, lifetime and consumed electrical power.

Meanwhile, in such organic EL elements, a patterning method in which a non-light-emitting region is formed by irradiating an organic functional layer stacked on a glass substrate with ultraviolet ray to allow the irradiated part to deteriorate has been provided (for example, see Patent Literature 1).

However, in the case when an organic EL element is constituted by stacking a pair of electrodes and an organic functional layer, and the like on a resin substrate, if patterning is conducted by irradiating the organic functional layer with ultraviolet ray (for example, see Patent Literature 2), the resin substrate is also irradiated with the ultraviolet ray, and thus a phenomenon in which the color of the resin substrate is changed into yellow occurs. Therefore, it is necessary to shorten the time for irradiating the organic functional layer with the ultraviolet ray, and thus it is impossible to form a non-light-emitting region in which the light emission of the organic functional layer has been sufficiently lost.

CITATION LIST

Patent Literatures

Patent Literature 1: JP 2793373 B
Patent Literature 2: JP 2005-183045 A

SUMMARY OF INVENTION

Technical Problem

The present invention has been made with considering for the above-mentioned problem and situation, and the problem to be solved by the present invention is to provide a method for producing an organic electroluminescent element, by which a non-light-emitting region can be formed without any accompanying discoloration of a resin substrate.

Solution to Problem

The present inventors have considered about the cause of the above-mentioned problem, and the like so as to solve the above-mentioned problem according to the present invention, and found that, by irradiating a prescribed region of an organic functional layer with light being free from wavelength components at 340 nm or less, the prescribed region can be formed into a non-light-emitting region without causing any accompanying discoloration of a resin substrate.

That is, the above-mentioned problem according to the present invention is solved by the following means.

1. A method for producing an organic electroluminescent element, including: a stacking step, in which a first electrode, an organic functional layer and a second electrode are formed by stacking on a resin substrate, and a light irradiation step, in which a prescribed region of the organic functional layer is irradiated with light being free from wavelength components at 340 nm or less.

2. The method for producing an organic electroluminescent element according to Item. 1, further including a sealing step in which the organic functional layer is sealed after the stacking step, wherein the light irradiation step is conducted after the sealing step.

Advantageous Effects of Invention

According to the present invention, a method for producing an organic electroluminescent element, by which a non-light-emitting region can be formed without any accompanying discoloration of a resin substrate, can be provided.

The mechanism of expression of the effect and the mechanism of action of the present invention have not been clarified, but are conjectured as follows.

It is conjectured that, since the method for producing an organic EL element according to the present invention includes a step of irradiating a prescribed region with light being free from wavelength components at 340 nm or less, the decomposition of the resin compound that constitutes the resin substrate is not caused, and the function of the compound that is essential for a light emitting phenomenon among the materials constituting the organic functional layer can be lost, whereby the above-mentioned effect of the present invention can be obtained.

BRIEF DESCRIPTION OF DRAWINGS

FIG. 1 is a cross-sectional view showing a schematic constitution of an organic EL element.

DESCRIPTION OF EMBODIMENTS

The method for producing an organic electroluminescent element according to the present invention includes a stacking step, in which a first electrode, an organic functional layer and a second electrode are formed by stacking on a resin substrate, and a light irradiation step, in which a prescribed region of the organic functional layer is irradiated with light being free from wavelength components at 340 nm or less. This feature is a common technical feature between the inventions as claimed in the respective claims 1 and 2. In the present invention, the prescribed region is a region where the light emitting luminance should be decreased by irradiating with light in the light emitting surface of the organic functional layer in obtaining an organic EL element having a light emitting pattern with a desired, and may be a region that has been preset in advance, or a region that has been preset by a user.

Furthermore, it is preferable that the present invention further includes a sealing step in which the organic functional layer is sealed, after the stacking step, wherein the light irradiation step is conducted after the sealing step. Since the light irradiation step is conducted after the sealing step, light irradiation can be conducted in a state that the element is exposed to the atmospheric air, the light irradiation step can be simplified and the production cost can be decreased. Furthermore, since light can be emitted in a state that the element is exposed to the atmospheric air, the light irradiation step can be conducted after putting the element into a plane state by tight-bonding under a reduced pressure and the like, and thus a non-light-emitting region can be formed at a fine accuracy.

The non-light-emitting region as used herein in the present invention is a region in which the luminance has been decreased as compared to the luminance before irradiation of light by the lacking of a part of the light emitting function of the region, which had a light emitting function before irradiation of light, by the irradiation of light, and does not refer to only a region at a complete non-light-emitting state (a state in which the luminance is 0).

Hereinafter the present invention and the constitutional factors thereof, and the forms and embodiments for conducting the present invention will be explained in detail. In the present application, "to" is used with a meaning that the numerical values described before and after the word are included as the lower limit value and upper limit value.

<Constitution of Organic Electroluminescent Element>

The organic electroluminescent element according to the present invention (hereinafter also referred to as "organic EL element") may have various constitutions, and an example is shown in FIG. 1.

As shown in FIG. 1, the organic EL element 10 according to the present invention is disposed on a resin substrate 13, and is constituted by stacking a first electrode (transparent electrode) 1, an organic functional layer (light emitting functional layer) 3, which is constituted by using an organic material and the like, and a second electrode (counter electrode) 5a in this order from the side of the resin substrate 13. An extraction electrode 16 is disposed on the end part of the first electrode 1 (electrode layer 1b). The first electrode 1 and an external power source (illustration is omitted) are electrically connected through an extraction electrode 16. The organic EL element 10 is constituted so that light that has been generated (emitted light h) is extracted from at least the side of the resin substrate 13.

Furthermore, the layer structure of the organic EL element 10 is not limited, and may have a general layer structure. It is deemed here that the first electrode 1 functions as an anode (i.e., an anode) and the second electrode 5a functions as a cathode (i.e., a cathode). In this case, for example, the organic functional layer 3 is exemplified by a constitution in which a hole injection layer 3a/a hole transport layer 3b/a light emitting layer 3c/an electron transport layer 3d/an electron injection layer 3e are stacked in this order from the side of the first electrode 1, which is an anode, and it is essential to have the light emitting layer 3c that is constituted by using at least an organic material among these layers. The hole injection layer 3a and the hole transport layer 3b may be disposed as a hole transport-injection layer. The electron transport layer 3d and the electron injection layer 3e may be disposed as an electron transport-injection layer. Furthermore, there is also a case when, for example, the electron injection layer 3e among these organic functional layers 3 is constituted by an inorganic material.

Furthermore, in the organic functional layer 3, a hole blocking layer, an electron blocking layer and the like may be stacked on necessary portions as necessary besides these layers. Furthermore, the light emitting layer 3c may have a structure having light emitting layers of respective colors that generates emitted lights at the respective wavelength regions, wherein these light emitting layers of respective colors are stacked through non-light-emitting medium layers. The medium layers may function as hole blocking layers and electron blocking layers. Furthermore, the second electrode 5a, which is a cathode, may have a stacked structure as necessary. In such constitution, only the part where the organic functional layer 3 is sandwiched by the first electrode 1 and the second electrode 5a becomes the light-emitting region in the organic EL element 10.

Furthermore, in the layer constitution mentioned above, an assistant electrode 15 may be disposed in contact with the electrode layer 1b of the first electrode 1, for the purpose of decreasing the resistance of the first electrode 1.

The organic EL element 10 having the constitution as mentioned above is sealed by a sealing material 17, which will be mentioned below, on the resin substrate 13, for the purpose of preventing the deterioration of the organic functional layer 3, which is constituted by using the organic material and the like. This sealing material 17 is fixed on the side of the resin substrate 13 through an adhesive 19. However, the terminal parts of the first electrode 1 (extraction electrode 16) and the second electrode 5a are disposed in the state that they are exposed from the sealing material 17 in the state that the insulation properties are retained from each other by the organic functional layer 3 on the resin substrate 13.

Furthermore, the organic EL element 10 produced by the production method according to the present invention is such that a prescribed region of the organic functional layer 3 has been irradiated with light being free from wavelength components at 340 nm or less, whereby the irradiated part has been formed into a non-light-emitting region.

<Method for Producing Organic EL Element>

The method for producing an organic EL element of the present invention includes a stacking step, in which a first electrode, an organic functional layer and a second electrode are formed by stacking on a resin substrate, and a light irradiation step, in which a prescribed region of the organic functional layer is irradiated with light being free from wavelength components at 340 nm or less.

Here, as an example, the method for producing the organic EL element 10 shown in FIG. 1 will be explained.

(1) Stacking Step

In the method for producing an organic EL element according to the present invention, a step in which a first electrode 1, an organic functional layer 3 and a second electrode 5a are stacked and formed on a resin substrate 13 (stacking step) is conducted.

Firstly, the resin substrate 13 is prepared, and for example, the primer layer 1a formed of a nitrogen-containing compound containing nitrogen atoms is formed on the resin substrate 13 by a suitable method such as a deposition process so as to give a layer thickness of 1 μm or less, preferably in the range of from 10 to 100 nm.

Secondly, an electrode layer 1b formed of silver (or an alloy containing silver as a main component) is formed on the primer layer 1a by a suitable method such as a deposition process so as to give a layer thickness of 12 nm or less, preferably from 4 to 9 nm, whereby the first electrode 1 that becomes an anode is prepared. Simultaneously, an extraction electrode 16, which is to be connected to an external power source, is formed on the end part of the first electrode 1 by a suitable method such as a deposition process.

Secondly, a hole injection layer 3a, a hole transport layer 3b, a light emitting layer 3c, an electron transport layer 3d and an electron injection layer 3e are stacked therein in this order, whereby the organic functional layer 3 is formed.

For the formation of these respective layers, a spin coating process, a cast process, an inkjet process, a deposition process, a printing process and the like are exemplified, a vacuum deposition process or a spin coating process is specifically preferable from the viewpoints that homogeneous layers are easily obtained and pinholes are difficult to be generated. Furthermore, different formation processes may be applied to every layer. In the case when a deposition process is adopted for the formation of these respective layers, the deposition conditions differ depending on the kind of the compound used, and it is generally desirable to suitably select the respective conditions within the ranges of a boat heating temperature of from 50 to 450° C., a vacuum degree of from $1\times10^{-6}$ to $1\times10^{-2}$ Pa, a deposition velocity of from 0.01 to 50 nm/sec, a substrate temperature of from −50 to 300° C., and a layer thickness of from 0.1 to 5 μm.

The organic functional layer 3 is formed as above, and a second electrode 5a, which becomes a cathode, is formed by a suitable forming process such as a deposition process, a sputtering process or the like. At this time, the second electrode 5a is formed into a pattern in a shape in which the terminal part has been drawn on the peripheral edge of the resin substrate 13 from the upper side of the organic functional layer 3, while retaining an insulating state against the first electrode 1 by the organic functional layer 3.

(2) Sealing Step

After the stacking step, a step of sealing the organic functional layer 3 (sealing step) is conducted.

That is, a sealing material 17 that covers at least the organic functional layer 3 is disposed on the resin substrate 13 in the state that the terminal parts of the first electrode 1 (extraction electrode 16) and the second electrode 5a are exposed.

(3) Light-Irradiation Step

In the method for producing an organic EL element according to the present invention, a step in which a prescribed pattern region of the organic functional layer 3 is irradiated with light being free from wavelength components at 340 nm or less (light irradiation step) to form the irradiated part into a non-light-emitting region is further conducted. By this way, the light emitting function of the organic functional layer 3 is lost on the light-irradiated region without causing discoloration on the resin substrate 13, whereby the organic EL element 10 having a light emitting pattern can be produced.

In the light irradiation step, the method for irradiating light may be any method as long as the prescribed pattern region of the organic functional layer 3 can be irradiated with light to thereby form the irradiation part into a non-light-emitting region, and is not limited to a specific method.

The light irradiated in the light irradiation step contains at least ultraviolet ray, and may further contain visible ray or infrared ray. Furthermore, light being free from wavelength components at 340 nm or less is used in the present invention.

Meanwhile, in the present invention, the ultraviolet ray refers to an electromagnetic wave having a wavelength that is longer than that of X-ray and is shorter than the shortest wavelength of visible light, and is specifically an electromagnetic wave having a wavelength of from 1 to 400 nm.

Furthermore, in the present invention, "light being free from wavelength components at 340 nm or less" refers to light that has been allowed to pass through an optical filter having a light transmittance in the whole region of the wavelength region at 340 nm or less of 50% or less (the cut wavelength is 340 nm), in which the light in the whole region of the wavelength region at 340 nm or less has been cut to 50% or less from the light that has entered into the optical filter. Furthermore, in the case when laser light is irradiated, "light being free from wavelength components at 340 nm or less" refers to laser light having a wavelength of more than 340 nm and 400 nm or less.

The means for generating ultraviolet ray and the irradiation means may be means such that ultraviolet ray is generated and irradiated by a conventionally-known apparatus and the like, and are not specifically limited. Specific light sources include high pressure mercury lamps, low pressure mercury lamps, hydrogen (deuterated hydrogen) lamps, rare gas (xenon, argon, helium, neon and the like)-discharging lamps, nitrogen lasers, excimer lasers (XeCl, XeF, KrF, KrCl and the like), hydrogen lasers, halogen lasers, higher harmonic waves of various visible ray (LD)-infrared lasers (THG (Third Harmonic Generation) ray of YAG laser, and the like) and the like.

The method for irradiating light being free from wavelength components at 340 nm or less may be any method as long as the pattern region of the organic functional layer 3 can be irradiated with light to thereby form the irradiated part into a non-light-emitting region. Specific examples include a method including irradiating laser light having wavelength components of more than 340 nm and 400 nm or less, or a method including allowing light that is irradiated from a light source to pass through an optical filter that absorbs wavelength components at 340 nm or less. As such optical filter, for example, an ultraviolet absorption filter manufactured by Isuzu Glass, Ltd. can be used.

In the method including irradiating with laser light having wavelength components of more than 340 nm, the organic functional layer 3 is irradiated with the laser light in spots, and the position irradiated with the laser light is scanned by moving the laser light source relative to the organic functional layer 3, whereby the pattern region is irradiated with light.

Furthermore, in the method of allowing the irradiation light to pass through the optical filter, the regions other than the pattern region of the organic functional layer 3 are shielded with a mask, and the whole surface of the pattern region of the organic functional layer 3 is irradiated with light through the optical filter.

It is preferable that such light irradiation step is conducted after the sealing step.

In the case when the second electrode 5a does not have translucency, the resin substrate 13 is irradiated with light from the side of the light extraction surface 13a. In this case, since the organic functional layer 3 is irradiated with light through the resin substrate 13, it is necessary to sufficiently ensure the light irradiation time with consideration for the point that the resin substrate 13 absorbs irradiated light to some extent. In the present invention, a non-light-emitting region can be formed by irradiating with light being free from wavelength components at 340 nm or less, without causing discoloration in the resin substrate 13, and thus a light irradiation time can be sufficiently ensured. By this way, the light irradiation step can be conducted without decreasing the quality of the produced organic EL element. Furthermore, since the light irradiation step is conducted after the sealing step, it is possible to expose the sealed element to the air (an open system), and it is not necessary to conduct the light irradiation step in a closed system such as a chamber. Therefore, an organic EL element having a light emitting pattern can be produced at a low cost by easy production steps.

The light irradiation step may also be conducted before the sealing step, or may be conducted after the organic functional layer 3 has been formed and before the second electrode 5a is formed in the stacking step. In this case, the side of the resin substrate 13 may be irradiated with light, or the side of the organic functional layer 3 may be irradiated with light.

Furthermore, in the light irradiation step, it is possible to change the light emission luminance of the light irradiated part depending on a light irradiation amount, by changing the light irradiation amount by adjusting the light intensity or the irradiation time, or the like. The higher the light irradiation amount is, the more the attenuation of the light emitting luminance is, whereas the smaller the light irradiation amount is, the smaller the attenuation rate of the light emitting luminance is. Therefore, in the case when the light irradiation amount is 0, i.e., light irradiation has not been conducted, the light emitting luminance is at the maximum.

By this way, it is possible to impart a contrast to the light emitting luminance in the produced organic EL element, and the contrast can be changed also by increasing or decreasing the driving current. Furthermore, the driving voltage becomes a higher voltage in accordance with the attenuation of the luminance, but the luminance-voltage property is stable over time. Therefore, it is possible to produce an organic EL element in which a contrast appears on a light-emitting region during light emission can be produced.

By the above-mentioned way, an organic EL element having a desired light emitting pattern can be produced. In the production of such organic EL element 10, it is preferable to consistently prepare from the organic functional layer 3 to the second electrode 5a by a single aspiration, and it is also possible to take the resin substrate 13 out of the vacuum atmosphere in the midstream and subject the resin substrate 13 to a different forming process. In this case, considerations that the operations are conducted under a dry inert gas atmosphere, and the like are necessary.

In the case when a direct current voltage is applied to the organic EL element 10 obtained by this way, emission of light can be observed when a voltage of about 2 to 40 V is applied with deeming that the first electrode 1 as an anode has a positive polarity and the second electrode 5a as a cathode has a negative polarity. Alternatively, an alternate current voltage may be applied. The wave form of the alternate current voltage to be applied may be any form.

The details of the major respective layers for constituting the organic EL element 10 and the method for producing them will be explained below.

<Resin Substrate>

It is preferable that the resin substrate 13 is basically constituted by a resin substrate as a substrate, and one or more gas barrier layers each having a refractive index of from 1.4 or more and 1.7 or less.

(1) Resin Substrate

As the resin substrate in the present invention, a conventionally-known resin film substrate can be used without specific limitation. It is preferable that the resin substrate that is preferably used in the present invention has gas barrier performances that are necessary for an organic EL element such as humidity resistance/gas permeation resistance.

In the present invention, in the case when the side of the resin substrate 13 of the organic EL element 10 becomes a light emitting surface, a material having translucency against visible light is used in the resin substrate. In this case, the light transmittance is preferably 70% or more, more preferably 75% or more, further preferably 80% or more.

Furthermore, it is preferable that the resin substrate has flexibility. "Flexibility" as used herein refers to a substrate in which cracking and the like do not occur before and after winding the substrate around a roll having a diameter of 50 mm and winding the substrate at a prescribed tension force, and more preferably refers to a substrate that can wind around a roll having a diameter of 30 mm.

In the present invention, the resin substrate is a conventionally-known substrate, and examples include films of respective resins such as acrylic resins of acrylic acid esters, methacrylic acid esters, PMMA and the like, polyethylene telephthalates (PET), polybutylene telephthalates, polyethylene naphthalates (PEN), polycarbonates (PC), polyarylates, polyvinyl chlorides (PVC), polyethylenes (PE), polypropylenes (PP), polystyrenes (PS), nylons (Ny), aromatic polyamides, polyether ether ketones, polysulfones, polyether sulfonates, polyimides, polyether imides, polyolefins, and epoxy resins, and cycloolefin-based and cellulose ester-based resin substrates can also be used. Furthermore, a heat-resistant transparent film having silsesquioxane having an organic-inorganic hybrid structure as a basic backbone (product name: Sila-DEC, manufactured by Chisso Corporation), and resin films formed by stacking two or more of the above-mentioned resin materials, and the like can also be exemplified.

In view of cost and availability, PET, PEN, PC, acrylic resins and the like are preferably used.

Specifically, from the viewpoints of transparency, heat-resistance, easiness of handling, strength and cost, biaxially-drawn polyethylene telephthalate films and biaxially-drawn polyethylene naphthalate films are preferable.

Furthermore, in order to suppress the shrinking during thermal expansion to the maximum extent possible, a product that has been subjected to a low thermal shrinkage treatment such as thermal annealing is the most preferable.

The thickness of the resin substrate is preferably from 10 to 500 µm, more preferably from 20 to 250 µm, further preferably from 30 to 150 µm. By setting the thickness of the resin substrate to be within the range of from 10 to 500 µm, a stable gas barrier property can be obtained, and the resin substrate becomes suitable for transportation (conveyancing) of a roll-to roll system.

(2) Gas Barrier Layer (2.1) Property and Formation Method

In the present invention, one or more gas barrier layer having a refractive index of 1.4 or more and within 1.7 (low refractive index layer) may be disposed on the resin substrate of the resin substrate 13. As such gas barrier layer, a known material can be used without special limitation, and the gas barrier layer may be a coating formed of an inorganic substance or an organic substance, or a hybrid coating having these coatings in combination. The gas barrier layer is preferably a gas barrier film having a vapor permeation degree (25±0.5° C., relative humidity 90±2% RH) as measured by a method based on JIS-K-7129-1992 of 0.01 g/(m$^2 \cdot$24 h), and more preferably a gas barrier film having an oxygen permeation degree as measured by a method based on JIS-K-7126-1987 of 1×10$^{-3}$ ml/(m$^2 \cdot$24 h·atm) or less and a vapor permeation degree of 1×10$^{-5}$ g/(m$^2 \cdot$24 h) or less.

The material for forming such gas barrier layer may be any material that has a function to suppress the entering of substances that lead to deterioration such as moisture and oxygen, and for example, silicon oxide, silicon dioxide, silicon nitride and the like can be used. Furthermore, in order to improve the brittleness of the gas barrier layer, a structure in which a layer formed of an organic material (organic layer) is stacked as a stress relaxation layer on these inorganic layers may be formed. The order of stacking of the inorganic layers and the organic layers are not specifically limited, and it is preferable to alternately stack the both layers plural times.

The method for forming the gas barrier layer is not specifically limited, and for example, a vacuum deposition process, a sputtering process, a reactive sputtering process, a molecular beam epitaxy process, a cluster ion beam process, an ion plating process, a plasma polymerization process, an atmospheric pressure plasma polymerization process, a plasma CVD process, a laser CVD process, a thermal CVD process, a coating process and the like can be used, and a method according to the atmospheric pressure plasma polymerization process described in JP 2004-68143 A is specifically preferable.

(2.2) Inorganic Precursor Compound

Furthermore, the gas barrier layer may be formed by applying at least one layer of an application liquid containing an inorganic precursor compound on a resin substrate.

As the application method, any suitable method can be adopted.

Specific examples include a roll coating process, a flow coating process, an inkjet process, a spray coating process, a printing process, a dip coating process, a flow film process, a bar coating process, a gravure printing process and the like.

The application thickness can be suitably preset depending on the purpose. For example, the application thickness can be preset so that the layer thickness after drying becomes preferably from about 0.001 to 10 μm, more preferably from about 0.01 to 10 μm, and the most preferably from 0.03 to 1 μm.

The inorganic precursor compound used for the present invention is not specifically limited as long as it is a compound that can form a metal oxide, a metal nitride or a metal oxide nitride by vacuum ultraviolet ray irradiation under a specific atmosphere, and as the compounds that are suitable for the production method of the present invention, compounds that can be subjected to a modification treatment at a relatively low temperature as those described in JP 8-112879 A.

Specific examples can include polysiloxanes having Si—O—Si bonds (including polysilsesquioxane), polysilazanes having Si—N—Si bonds, polysiloxazanes having both Si—O—Si bonds and Si—N—Si bonds and the like. These can be used by mixing two or more kinds. Furthermore, these can also be used by successively stacking or simultaneously stacking different compounds.

<First Electrode (Transparent Electrode)>

As the first electrode, every electrode that can be used for an organic EL element can be generally used. Specific examples include aluminum, silver, magnesium, lithium, magnesium/copper mixture, magnesium/silver mixture, magnesium/aluminum mixture, magnesium/indium mixture, indium, lithium/aluminum mixture, rare earth metals, oxide semiconductors such as ITO, ZnO, TiO$_2$ and SnO$_2$, and the like.

In the present invention, the first electrode is preferably a transparent electrode, further preferably a transparent metal electrode.

For example, as shown in FIG. 1, the first electrode 1 has a two layer structure in which a primer layer 1a, and an electrode layer 1b that is formed on the upper part thereof are stacked in this order from the side of the resin substrate 13. Of these, the electrode layer 1b is, for example, a layer constituted by using silver or an alloy containing silver as a main component, and the primer layer 1a is, for example, a layer constituted by using a compound containing a nitrogen atom.

The "transparent" in the first electrode 1 refers to that the light transmittance at a wavelength of 550 nm is 50% or more. Furthermore, the main component in the electrode layer 1b is that the content in the electrode layer 1b is 98% mass or more.

(1) Primer Layer

The primer layer 1a is a layer that is disposed on the side of the resin substrate 13 of the electrode layer 1b. The material that constitutes the primer layer 1a is not specifically limited, and may be any material that can suppress the flocculation of silver in the formation of the electrode layer 1b formed of silver or an alloy containing silver as a main component, and examples include nitrogen-containing compounds containing a nitrogen atom and the like.

In the case when the primer layer 1a is formed of a low refractive index material (refractive index: lower than 1.7), it is necessary that the upper limit of the film thickness is lower than 50 nm, and the upper limit is preferably lower than 30 nm, preferably lower than 10 nm more, and specifically preferably lower than 5 nm. By adjusting the film thickness to lower than 50 nm, the optical loss can be suppressed to be minimum. On the other hand, it is necessary that the lower limit of the film thickness is 0.05 nm or more, and the lower limit is preferably 0.1 nm or more, and specifically preferably 0.3 nm or more. By adjusting the film thickness to be 0.05 nm or more, the film formation of the primer layer 1a can be made homogeneous, and the effect thereof (suppression of flocculation of silver) can be made homogeneous.

In the case when the primer layer 1a is formed of a high refractive index material (refractive index: 1.7 or more), the upper limit of the film thickness is not specifically limited, and the lower limit of the film thickness is similar to that in the above-mentioned case when the primer layer 1a is formed of the low refractive index material.

However, as the function of a mere primer layer 1a, it is sufficient that the primer layer 1a is formed at a necessary film thickness by which homogeneous film formation can be obtained.

Examples of the film formation method for the primer layer 1a include methods using wet processes such as an application process, an inkjet process, a coating process and a dip process, methods using a deposition process (resistance heating, an EB process and the like), a sputtering process and a CVD process, and the like. Among these, a deposition process is preferably applied.

The compound containing a nitrogen atom which constitutes the primer layer 1a is not specifically limited as long as it is a compound containing a nitrogen atom in a molecule, and is preferably a compound having a nitrogen atom as a hetero atom. Examples of the compound having a nitrogen atom as a hetero atom include azilidine, aziline, azetidine, azeto, azolidine, azole, adinane, pyridine, azepane, azepine, imidazole, pyrazole, oxazole, thiazole, imidazoline, pyrazine, morpholine, thiazine, indole, isoindole, benzimidazole, purine, quinoline, isquinoline, quinoxaline, cinnoline, pteridine, acridine, carbazole, benzo-C-cinnoline, porphyrine, chrolin, cholin and the like.

(2) Electrode Layer

The electrode layer 1b is a layer constituted by using silver or an alloy containing silver as a main component, and is a layer that has been formed on the primer layer 1a.

Examples of the method for the film formation of such electrode layer 1b include methods using wet processes such as an application process, an inkjet process, a coating process and a dip process, methods using dry processes such as a deposition process (resistance heating, an EB process and the like), a sputtering process and a CVD process. Among these, a deposition process is preferably applied.

Furthermore, the electrode layer 1b sufficiently has electroconductivity without a high temperature annealing treatment and the like after the film formation of the electrode layer 1b, by being formed on the primer layer 1a; however, where necessary, a high temperature annealing treatment and the like can be conducted after the film formation.

Examples of the alloy containing silver (Ag) as a main component which constitutes the electrode layer 1b include silver-magnesium (AgMg), silver-copper (AgCu), silver-palladium (AgPd), silver-palladium-copper (AgPdCu), silver-indium (AgIn) and the like.

The electrode layer 1b as mentioned above may have a constitution in which a layer of silver or an alloy containing silver as a main component is divided into plural layers and stacked as necessary.

Furthermore, it is preferable that this electrode layer 1b has a film thickness within a range of from 4 to 9 nm. In the case when the film thickness is thinner than 9 nm, the absorbed components or reflected components of the layer are small, and thus the first electrode 1 has a high transmittance. Furthermore, in the case when the film thickness is thicker than 4 nm, the electroconductivity of the layer can be sufficiently ensured.

The first electrode 1 having a stacking structure composed of the primer layer 1a and the electrode layer 1b formed thereon as mentioned above may be such that the upper part of the electrode layer 1b is covered with a protective film, or another electrode layer may be stacked thereon. In this case, it is preferable that the protective film and another electrode layer have light transmittivity so that the light transmittivity of the first electrode 1 is not lost.

(3) Effect of First Electrode (Transparent Electrode)

The first electrode 1 having the above-mentioned constitution has, for example, a constitution in which the electrode layer 1b formed of silver or an alloy containing silver as a main component is disposed on the primer layer 1a that is constituted by using the compound containing a nitrogen atom. Accordingly, in the film formation of the electrode layer 1b on the upper part of the primer layer 1a, the silver atom that constitutes the electrode layer 1b interacts with the compound containing a nitrogen atom that constitutes the primer layer 1a, and thus the diffusion distance of the silver atom on the surface of the primer layer 1a decreases, and the flocculation of the silver is suppressed.

Meanwhile, in general, in the film formation of the electrode layer 1b containing silver as a main component, since a thin film grows in a nuclear growth type (Volumer-Weber: VW type), the silver particles are easily isolated in insular forms, it is difficult to obtain electroconductivity when the film thickness is thin, and the value of the sheet resistance increases. Therefore, it is necessary to thicken the film thickness so as to ensure electroconductivity, but when the film thickness is thicken, the light transmittance is decreased, and thus the electrode layer is not suitable as the first electrode.

However, according to the first electrode 1, the flocculation of the silver is suppressed on the primer layer 1a as mentioned above. Therefore, in the film formation of the electrode layer 1b formed of silver or an alloy containing silver as a main component, the thin film grows by a single layer growth type (Frank-van der Merwe: FM type).

Furthermore, the "transparent" in the first electrode 1 refers to having a light transmittance at a wavelength of 550 nm of 50% or more, but the above-mentioned each material used as the primer layer 1a is a film having a sufficiently fine light transmittivity as compared to that of the electrode layer 1b formed of silver or an alloy containing silver as a main component. On the other hand, the electroconductivity of the first electrode 1 is mainly ensured by the electrode layer 1b. Therefore, since the electrode layer 1b formed of silver or an alloy containing silver as a main component becomes an electrode layer having an ensured electroconductivity at a thinner film thickness as mentioned above, the electroconductivity and light transmittivity of the first electrode 1 can be improved at the same time.

<Organic Functional Layer (Light Emitting Functional Layer)>

(1) Light Emitting Layer

The organic functional layer 3 contains at least a light emitting layer 3c.

The light emitting layer 3c used in the present invention contains a phosphorescent compound as a light emitting material. A fluorescent material may also be used as the light emitting material, or a phosphorescent compound and a fluorescent material may be used in combination.

This light emitting layer 3c is a layer that emits light by the re-bonding of the electrons that have been injected from the electrode or the electron transport layer 3d and the holes that have been injected from the hole transport layer 3b, and the part where the light is emitted may be in the layer of the light emitting layer 3c or the interface between the light emitting layer 3c and the adjacent layer.

The constitution of such light emitting layer 3c is not specifically limited as long as the light emitting material contained therein satisfies requirements of light emission. Furthermore, there may be plural layers each having one light emission spectrum or light emission maximum wavelength. In this case, it is preferable that a non-light-emitting medium layer (illustration is omitted) is disposed between the respective light emitting layers 3c.

The sum of the film thicknesses of the light emitting layers 3c is preferably within the range from 1 to 100 nm, more preferably within the range from 1 to 30 nm, since a lower driving voltage can be obtained.

In the case when a non-light-emitting medium layer is present between the light emitting layers 3c, the sum of the film thicknesses of the light emitting layers 3c is a film thickness including the medium layer.

In the case of the light emitting layer 3c having a constitution in which plural layers are stacked, the film thickness of each light emitting layer is adjusted to be preferably within the range of from 1 to 50 nm, more preferably within the range of from 1 to 20 nm. In the case when the stacked plural light emitting layers correspond to the respective colors of light emission of blue, green and red, the relationship of the film thicknesses of the respective light emitting layers of blue, green and red are not specifically limited.

The light emitting layer 3c mentioned above can be formed by subjecting a known light emitting material and a host compound to a known method for forming a thin film such as a vacuum deposition process, a spin coat process, a cast process, an LB process or an inkjet process.

Furthermore, the light emitting layer 3c may be such that plural light emitting materials are mixed.

As the constitution of the light emitting layer 3c, it is preferable to contain a host compound (also referred to as a light emitting host or the like), a light emitting material (also referred to as a light emitting dopant) and to allow the light emitting material to emit light.

(2) Injection Layers (Hole Injection Layer, Electron Injection Layer)

Injection layers are layers that are disposed between the electrode and the light emitting layer 3c so as to decrease a driving voltage and improve a light emitting luminance, are described in detail in "Frontline of Organic EL elements and Industrialization (Nov. 30, 1998, published by NTS)", Part 2, Chapter 2, "Electrode Materials" (pages 123 to 166), and includes a hole injection layer 3a and an electron injection layer 3e.

The injection layers can be disposed as necessary. The hole injection layer 3a may be disposed between the anode and the light emitting layer 3c or the hole transport layer 3b, and the electron injection layer 3e may be disposed between the cathode and the light emitting layer 3c or the electron transport layer 3d.

The details of the hole injection layer 3a are also described in JP 9-45479 A, 9-260062 A, 8-288069 A and the like, and specific examples include phthalocyanine layers as represented by copper phthalocyanine, oxide layers as represented by vanadium oxide, amorphous carbon layers, polymer layers using electroconductive polymers such as polyaniline (emeraldine) and polythiophene, and the like.

The details of the electron injection layer 3e are also described in JP 6-325871 A, 9-17574 A, 10-74586 A and the like, and specific examples include metal layers as represented by strontium and aluminum, alkali metal halide layers as represented by potassium fluoride, alkaline earth metal compound layers as represented by magnesium fluoride, oxide layers as represented by molybdenum oxide, and the like. It is desirable that the electron injection layer 3e of the present invention is a quite thin film, and the film thickness thereof is preferably in the range of from 1 nm to 10 μm depending on the material.

(3) Hole Transport Layer

The hole transport layer 3b is formed of a hole transport material having a function to transport holes, and the hole injection layer 3a and an electron blocking layer are also encompassed in the hole transport layer 3b in a broad sense. The hole transport layer 3b can be disposed as a single layer or plural layers.

The hole transport material is a material having either of a hole injection or transporting property, or an electron barrier property, and may be either of an organic substance or an inorganic substance. Examples include triazole derivatives, oxadiazole derivatives, imidazole derivatives, polyarylalkane derivatives, pyrazoline derivatives and pyrazolone derivatives, phenylenediamine derivatives, arylamine derivatives, amino-substituted calcone derivatives, oxazole derivatives, styrylanthracene derivatives, fluorenone derivative, hydrazone derivatives, stilbene derivatives, silazane derivatives and aniline-based copolymers, and electroconductive polymeric oligomers, specifically thiophene oligomers, and the like.

As the hole transport material, those mentioned above can be used, and it is preferable to use porphyrin compounds, aromatic tertiary amine compounds and styrylamine compounds, specifically aromatic tertiary amine compounds are preferably used.

Representative examples of the aromatic tertiary amine compounds and styrylamine compounds include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbenzene; and N-phenylcarbazole, as well as compounds having two condensed aromatic rings in a molecule as described in U.S. Pat. No. 5,061,569 B such as 4,4'-bis[N-(1-naphthyl)-N-phenylamino]biphenyl (NPD), and 4,4',4''-tris[N-(3-methylphenyl)-N-phenylamino]triphenylamine (MTDATA) described in JP 4-308688 A, which has three triphenylamine units that are connected in a starburst form, and the like.

Furthermore, polymer materials in which these materials are introduced in a polymer chain, or polymer materials using these materials as a polymer main chain can also be used. Furthermore, inorganic compounds such as p-type-Si and p-type-SiC can also be used as the hole injection materials and hole transport materials.

Alternatively, so-called p-type hole transport materials as described in JP 11-251067 A and J. Huang et. al., Applied Physics Letters, 80 (2002), p. 139 can also be used. In the present invention, it is preferable to use these materials since a light emitting element having a higher efficiency can be obtained.

The hole transport layer 3b can be formed by forming the above-mentioned hole transport material into a thin film by a known method such as a vacuum deposition process, a spin coat process, a cast process, a printing process including an inkjet process, or an LB process. The film thickness of the hole transport layer 3b is not specifically limited, and is generally from about 5 nm to 5 μm, preferably from 5 to 200 nm. This hole transport layer 3b may have a single layer structure composed of one or two or more kinds of the above-mentioned materials.

Furthermore, the p-property can be increased by doping the material of the hole transport layer 3b with an impurity. Examples include those described in JP 4-297076 A, JP 2000-196140 A, 2001-102175 A, J. Appl. Phys., 95, 5773 (2004) and the like.

It is preferable to increase the p-property of the hole transport layer 3b by this way since an element that consumes a lesser electrical power can be prepared.

(4) Electron Transport Layer

The electron transport layer 3d is formed of a material having a function to transport electrons, and the electron injection layer 3e and a hole blocking layer (the illustration is omitted) are also encompassed in the electron transport layer 3d in a broad sense. The electron transport layer 3d can be disposed as a single layer structure or a stacked structure of plural layers.

In the electron transport layer 3d having a single layer structure and the electron transport layer 3d having a stacking structure, it is sufficient that the electron transport material (this also serves as a hole blocking material) for constituting a layer part that is adjacent to the light emitting layer 3c has a function to transmit the electrons that has been injected from the cathode to the light emitting layer 3c. As such material, an arbitrary material can be selected from conventionally-known compounds and used. Examples include nitro-substituted fluorene derivatives, diphenylquinone derivatives, thiopyrandioxide derivatives, carbodiimide, fluorenilidenemethane derivatives, anthraquinodimethane, anthrone derivatives and oxadiazole derivatives and the like. Furthermore, thiadiazole derivatives in which the oxygen atom has been replaced with a sulfur atom in the oxadiazole ring of the above-mentioned oxadiazole derivatives, and quinoxaline derivatives having a quinoxaline ring, which is known as an electron withdrawing group, can also be used as the materials for the electron transport layer 3d. Furthermore, polymer materials in which these materials are introduced in a polymer chain, or using these materials as a polymer main chain can also be used.

Furthermore, metal complexes of 8-quinolinol derivatives such as tris(8-quinolinol)aluminum ($Alq_3$), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq), and metal complexes in which the center metal of these metal complexes has been replaced with In, Mg, Cu, Ca, Sn, Ga or Pb can also be used as the materials for the electron transport layer 3d.

In addition, metal-free or metal phthalocyanines, or metal-free or metal phthalocyanines in which each terminal thereof has been substituted with an alkyl group, a sulfonate groups or the like can also be preferably used as the materials for the electron transport layer 3d. Furthermore, the distyrylpyrazine derivatives, which are also exemplified as the materials for the light emitting layer 3c, can also be used as the materials for the electron transport layer 3d, and inorganic semiconductors such as n-type-Si and n-type-SiC can also be used as the materials for the electron transport layer 3d as in the hole injection layer 3a and the hole transport layer 3b.

The electron transport layer 3d can be formed by forming the above-mentioned material into a thin film, by, for example, a known method such as a vacuum deposition process, a spin coat process, a cast process, a printing process including an inkjet process, or an LB process. The film thickness of the electron transport layer 3d is not specifically limited, and is generally from about 5 nm to 5 μm, preferably from 5 to 200 nm. The electron transport layer 3d may have a single layer structure formed of one kind or two or more kinds of the above-mentioned materials.

Furthermore, the n-property can be increased by doping the electron transport layer 3d with an impurity. Examples thereof include the impurities described in JP 4-297076 A, 10-270172 A, JP 2000-196140 A, 2001-102175 A, J. Appl. Phys., 95, 5773 (2004) and the like. Furthermore, it is preferable that the electron transport layer 3d contains potassium or a potassium compound or the like. As the potassium compound, for example, potassium fluoride or the like can be used. If the n-property of the electron transport layer 3d is increased in such way, an element that consumes a lower electrical power can be prepared.

Furthermore, as the material for the electron transport layer 3d (electron transport compound), a material that is similar to the material that constitutes the above-mentioned primer layer 1a may also be used. This also applies to the electron transport layer 3d that also serves as the electron injection layer 3e, and a material that is similar to the material that constitutes the above-mentioned primer layer 1a may also be used.

(5) Blocking Layers (Hole Blocking Layer, Electron Blocking Layer)

The blocking layers may further be disposed as the organic functional layer 3 besides the above-mentioned respective functional layers. Examples include the hole blocking (hole block) layers described in JP 11-204258 A, 11-204359 A, and page 237 of "Frontline of Organic EL elements and Industrialization (Nov. 30, 1998, published by NTS)", and the like.

The hole blocking layer has the function of the electron transport layer 3d in a broad sense. The hole blocking layer is formed of a hole blocking material that has a significantly small ability to transport holes but also has a function to transport electrons, and thus can improve the probability of re-bonding of electrons and holes by blocking holes while transporting electrons. Furthermore, where necessary, the constitution of the electron transport layer 3d, which will be mentioned below, can be used as the hole blocking layer according to the present invention. It is preferable that the hole blocking layer is disposed adjacent to the light emitting layer 3c.

On the other hand, the electron blocking layer has the function of the hole transport layer 3b in a broad sense. The electron blocking layer is formed of a material that has a significantly small ability to transport electrons but also has a function to transport holes, and thus can improve the probability of re-bonding of electrons and holes by blocking electrons while transporting holes. Furthermore, where necessary, the constitution of the hole transport layer 3b, which will be mentioned below, can be used as the electron blocking layer. The hole blocking layer in the present invention has a film thickness of preferably from 3 to 100 nm, more preferably from 5 to 30 nm.

<Second Electrode (Counter Electrode)>

The second electrode 5a is an electrode film that functions as a cathode for supplying electrons to the organic functional layer 3, and metals, alloys, organic or inorganic electroconductive compounds, and mixtures thereof are used. Specific examples include aluminum, silver, magnesium, lithium, magnesium/copper mixture, magnesium/silver mixture, magnesium/aluminum mixture, magnesium/indium mixture, indium, lithium/aluminum mixture, rare earth metals, oxide semiconductors such as ITO, ZnO, $TiO_2$ and $SnO_2$, and the like.

The second electrode 5a can be prepared by forming these electroconductive materials into a thin film by a method such as deposition or sputtering. Furthermore, the sheet resistance as the second electrode 5a is preferably several hundreds of ohms/square or less, and the film thickness is selected generally within the scope from 5 nm to 5 μm, preferably within the scope from 5 to 200 nm.

In the case when this organic EL element 10 is such that emitted light h is extracted also from the side of the second electrode 5a, it is sufficient to constitute the second electrode 5a by selecting a light transmittive fine electroconductive material from the above-mentioned electroconductive materials.

<Extraction Electrode>

The extraction electrode 16 electrically connects the first electrode 1 and an external power source, and the material thereof is not specifically limited, and a known material can be preferably used. For example, metal films such as an MAM electrode formed of a three layer structure (Mo/Al—Nd alloy/Mo) can be used.

<Assistant Electrode>

The assistant electrode 15 is disposed for the purpose of decreasing the resistance of the first electrode 1, and is disposed in contact with the electrode layer 1b of the first electrode 1. The material that forms the assistant electrode 15 is preferably a metal having a low resistance such as gold, platinum, silver, copper or aluminum. Since these metals have low light transmittivity, a pattern is formed within the range that is not affected by the extraction of the emitted light h from the light extraction surface 13a.

Examples of the method for forming such assistant electrode 15 include a deposition process, a sputtering process, a printing process, an inkjet process, an aerosol jet process and the like. The line width of the assistant electrode 15 is preferably 50 μm or less in view of an aperture rate at which light is extracted, and the thickness of the assistant electrode 15 is 1 μm or more in view of electroconductivity.

<Sealing Material>

The sealing material 17 covers the organic EL element 10, and may be fixed on the side of the resin substrate 13 by an adhesive 19 by a plate-shaped (film-shaped) sealing element as in the illustrated example, or may be a sealing film (illustration is omitted). Such sealing material 17 is disposed in such a state that the terminal parts of the first electrode 1 and the second electrode 5a in the organic EL element 10 are exposed, and that the sealing material 17 covers at least the organic functional layer 3. Furthermore, it is also preferable to constitute by disposing an electrode on the sealing material 17 so that the terminal parts of the first electrode 1 and the second electrode 5a of the organic EL element 10 and this electrode are allowed to conduct.

Specific examples of the plate-like (film-like) sealing material 17 include glass substrates, polymer substrates, metal substrates and the like, and these substrate materials may further be formed into thin film forms and used. Specific examples of the glass substrates can include soda lime glass, barium-strontium-containing glass, lead glass, aluminosilicate glass, borosilicate glass, barium borosilicate glass, quartz and the like. Examples of the polymer substrates can include polycarbonates, acrylics, polyethylene telephthalates, polyethersulfides, polysulfones and the like. Examples of the metal substrates include those formed of one or more kind of metal selected from the group consisting of stainless, iron, copper, aluminum, magnesium, nickel, zinc, chromium, titanium, molybdenum, silicon, germanium and tantalum, or alloys thereof.

Among these, polymer substrates and metal substrates that have been formed into thin film forms can be preferably used as the sealing material 17 since elements can be formed into thin films.

Furthermore, the polymer substrates that have been formed into film forms are preferably those having an oxygen permeation degree as measured by a method based on JIS-K-7126-1987 of $1 \times 10^{-3}$ ml/(m$^2$·24 h·atm) or less, and a vapor permeation degree (25±0.5° C., relative humidity 90±2% RH) as measured by a method based on JIS K 7129-1992 of $1 \times 10^{-3}$ g/(m$^2$·24 h) or less.

Furthermore, the substrate materials as mentioned above may be processed into a concaved plate form and used as the sealing material 17. In this case, the above-mentioned substrate elements are each subjected to a processing such as a sand blast processing or a chemical etching processing, whereby a concaved shape is formed.

The adhesive 19 for fixing such plate-like sealing material 17 on the side of the resin substrate 13 is used as a sealant for sealing the organic EL element 10 that is sandwiched between the sealing material 17 and the resin substrate 13. Specific examples of such adhesive 19 can include photocurable and thermosetting adhesives having reactive vinyl groups such as acrylic acid-based oligomers and methacrylic acid-based oligomers, and adhesives of a moisture-curable type and the like such as 2-cyanoacrylic acid esters.

Furthermore, thermal and chemical curable types (two-liquid mix) such as epoxy-based adhesives can be exemplified as such adhesive 19. Moreover, hot-melt type polyamides, polyesters and polyolefins can be exemplified. In addition, cation-curable type UV-curable epoxy resin adhesives can be exemplified.

The organic materials that constitute the organic EL element 10 may be deteriorated by a thermal treatment. Therefore, it is preferable that the adhesive 19 can adhere and be cured at from room temperature to 80° C. Furthermore, a desiccant may be dispersed in advance in the adhesive 19.

The adhesive 19 may be applied to the adhesion part between the sealing material 17 and the resin substrate 13 by using a commercially available dispenser, or may be printed on the adhesion part in a similar manner to screen printing.

Furthermore, in the case a gap is formed among the plate-like sealing material 17, the resin substrate 13 and the adhesive 19, it is preferable to inject an inert gas such as nitrogen or argon or an inert liquid such a hydrocarbon fluoride or a silicon oil in this gap in a vapor phase and a liquid phase. Alternatively, it is also possible to make the gap vacuum. Alternatively, a hygroscopic compound can be enclosed therein.

Examples of the hygroscopic compound include metal oxides (for example, sodium oxide, potassium oxide, calcium oxide, barium oxide, magnesium oxide, aluminum oxide and the like), sulfate salts (for example, sodium sulfate, calcium sulfate, magnesium sulfate, cobalt sulfate and the like), metal halides (for example, calcium chloride, magnesium chloride, cesium chloride, tantalum fluoride, cerium bromide, magnesium bromide, barium iodide, magnesium iodide and the like), perchlorates (for example, barium perchlorate, magnesium perchlorate and the like) and the like, and anhydrous salts are preferably used in the sulfate salts, metal halides and perchlorates.

On the other hand, in the case when a sealing film is used as the sealing material 17, the sealing film is disposed on the resin substrate 13 in the state that the sealing film completely covers the organic functional layer 3 in the organic EL element 10 and the terminal parts of the first electrode 1 and the second electrode 5a in the organic EL element 10 are exposed. In the case when the organic EL element 10 having flexibility is prepared, the sealing material 17 is preferably a sealing film since flexibility is also required for the sealing material 17.

Such sealing film is constituted by using an inorganic material and an organic material. Specifically, the sealing film is constituted by a material having a function to suppress the entering of substances such as moisture and oxygen that lead to the deterioration of the organic functional layer 3 in the organic EL element 10. As such material, for example, inorganic materials such as silicon oxide, silicon dioxide and silicon nitride are used. Furthermore, in order to improve the brittleness of the sealing film, a stacking structure may also be formed by using a film formed of an organic material together with the films formed of these inorganic materials.

The method for forming these films is not specifically limited, and for example, a vacuum deposition process, a sputtering process, a reactive sputtering process, a molecular ray epitaxy process, a cluster ion beam process, an ion plating process, a plasma polymerization process, an atmospheric pressure plasma polymerization process, a plasma CVD process, a laser CVD process, a thermal CVD process, a coating process and the like can be used.

<Protective Film and Protection Plate>

In addition, a protective film or protection plate, for which illustration is omitted herein, may be disposed by interposing the organic EL element 10 and sealing material 17 between the protective film or protection plate and the resin substrate 13. This protective film or protection plate is for mechanically protecting the organic EL element 10, and specifically in the case when the sealing material 17 is a sealing film, since mechanical protection against the organic EL element 10 is not sufficient, it is preferable to dispose such protective film or protection plate.

For the protective film or protection plate as mentioned above, a glass plate, a polymer plate, a polymer film that is thinner than these plates, a metal plate, a metal film that is thinner than this metal plate, or a polymer material film or a metal material film is applied. Among these, it is specifically preferable to use the polymer film from the viewpoints of light weight, and formation of elements into thin films.

EXAMPLES

The present invention will be specifically explained with referring to Examples, but the present invention is not limited to these Examples.

Example 1

Preparation of Organic EL Element 101 Having Light Emitting Pattern

Nitrogen-containing compound N-1 represented by the following formula was formed into a film at a thickness of 25 nm on a PET transparent resin substrate having a thickness of 75 μm and having a gas barrier layer in which polysilazane and an organic layer (stress relaxation layer) have been stacked, and silver was formed into a film at a thickness of 10 nm as an anode by using a mask in a vacuum deposition apparatus. The gas barrier layer of the transparent resin substrate was formed in a similar manner to that for the barrier film sample 1 in Example 1 of JP 2012-599 A.

Furthermore, CuPc (copper phthalocyanine) as a hole injection material, α-NPD as a hole transport material, DPVBi as a host compound for a blue light emitting layer, FIr(pic) as a dopant for the blue light emitting layer, CBP as a host compound for a green light emitting layer, Ir(ppy)$_3$ as a dopant for the green light emitting layer, Ir(piq)$_3$ as a dopant for a red light emitting layer, BAlq as a hole blocking material, Alq$_3$ as an electron transport material, and LiF as an electron injection material were filled in respective deposition crucibles in optimal amounts for the preparation of the respective elements. The deposition crucibles used were those prepared by resistance heating materials formed of molybdenum or tungsten.

N-1, CuPc, α-NPD, DPVBi, FIr(pic), CBP, Ir(ppy)$_3$, Ir(piq)$_3$, Balq and Alq$_3$ are respectively shown below.

[Chemical Formula 1]

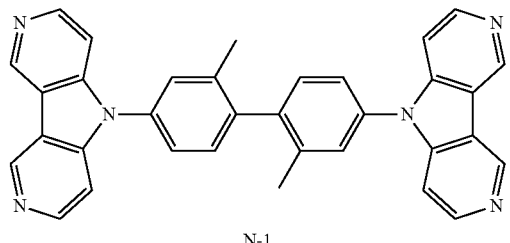

N-1

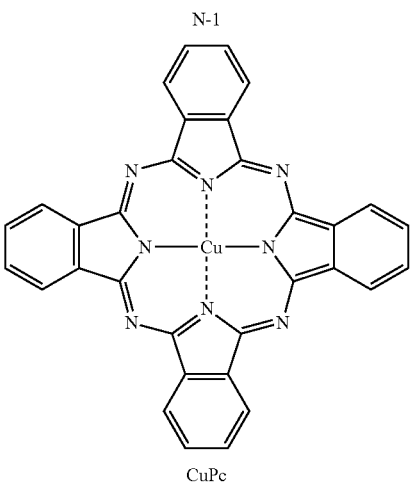

CuPc

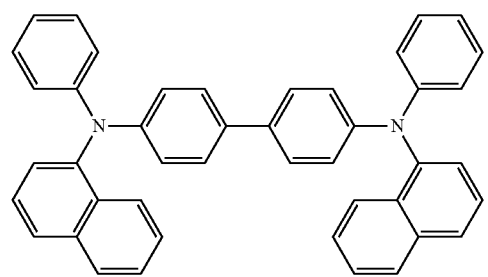

α-NPD

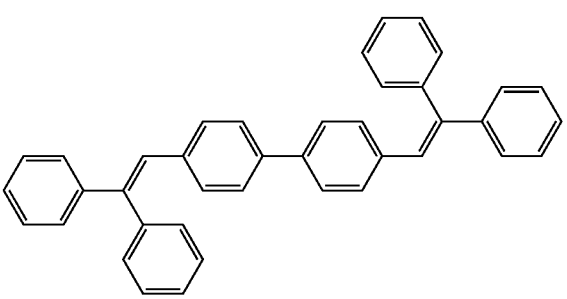

DPVBi

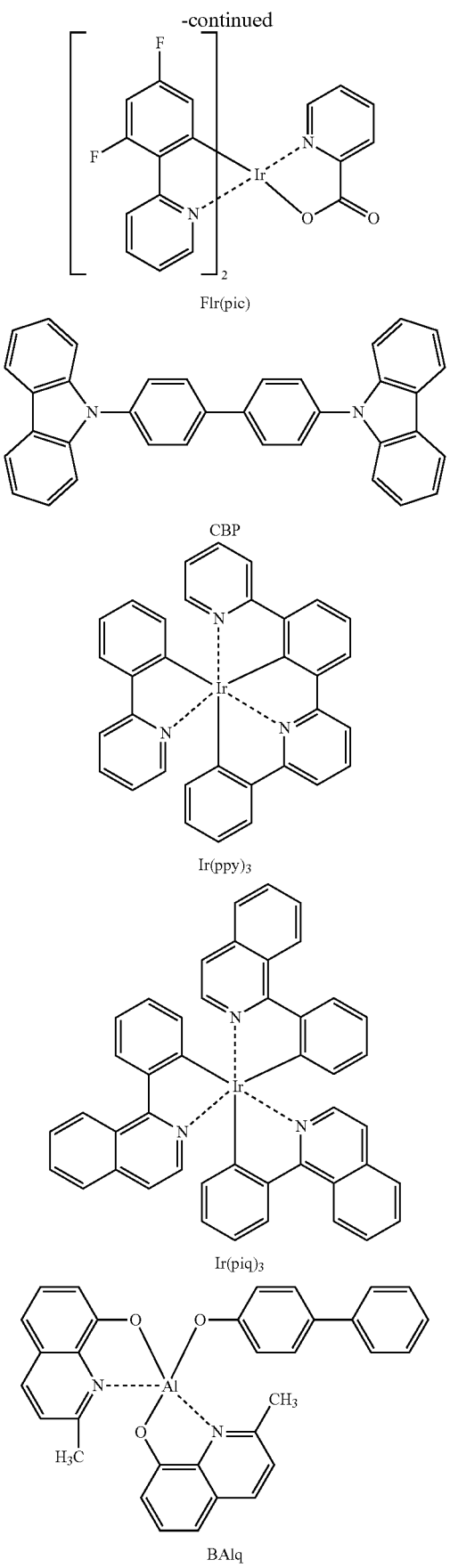
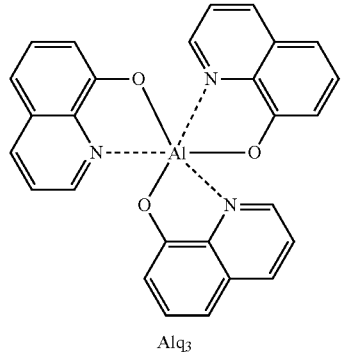

Subsequently, the pressure was reduced to a vacuum degree of $4 \times 10^{-4}$ Pa, and the above-mentioned deposition crucible containing CuPc was heated by energization, and CuPc was deposited at a deposition velocity of 0.1 nm/sec on the side of an ITO electrode of the resin substrate, whereby a hole injection layer having a layer thickness of 15 nm was disposed.

Subsequently, the above-mentioned deposition crucible containing α-NPD was heated by energization, and α-NPD was deposited at a deposition velocity of 0.1 nm/sec on the hole injection layer, whereby a hole transport layer having a layer thickness of 25 nm was disposed.

Subsequently, the above-mentioned deposition crucibles each containing 3% mass of FIr(pic) and DPVBi were heated by energization, and FIr(pic) and DPVBi were co-deposited at a total deposition velocity of 0.1 nm/sec on the hole transport layer, whereby a blue light emitting layer having a layer thickness of 15 nm was disposed.

Subsequently, the above-mentioned deposition crucible containing CBP was heated by energization, and CBP was deposited at a deposition velocity of 0.1 nm/sec on the blue light emitting layer, whereby a first medium layer having a layer thickness of 5 nm was disposed.

Subsequently, the above-mentioned deposition crucibles each containing 5% mass of Ir(ppy)₃ and CBP were heated by energization, and Ir(ppy)₃ and CBP were co-deposited at a total deposition velocity of 0.1 nm/sec on the first medium layer, whereby a green light emitting layer having a layer thickness of 10 nm was disposed.

Subsequently, the above-mentioned deposition crucible containing CBP was heated by energization, and CBP was deposited at a deposition velocity of 0.1 nm/sec on the green light emitting, whereby a second medium layer having a layer thickness of 5 nm was disposed.

Subsequently, the above-mentioned deposition crucibles each containing 8% mass of Ir(piq)₃ and CBP were heated by energization, and Ir(piq)₃ and CBP were co-deposited at a total deposition velocity of 0.1 nm/sec on the second medium layer, whereby a red light emitting layer having a layer thickness of 10 nm was disposed.

Subsequently, the above-mentioned deposition crucible containing BAlq was heated by energization, and BAlq was deposited at a deposition velocity of 0.1 nm/sec on the red light emitting layer, whereby a hole blocking layer having a layer thickness of 15 nm was disposed.

Subsequently, the above-mentioned deposition crucible containing Alq₃ was heated by energization, and Alq₃ was deposited at a deposition velocity of 0.1 nm/sec on the hole blocking layer, whereby an electron transport layer having a thickness of 30 nm was disposed.

Furthermore, the above-mentioned deposition crucible containing LiF was heated by energization, and LiF was deposited at a deposition velocity of 0.1 nm/sec on the electron transport layer, whereby an electron injection layer having a layer thickness of 1 nm was disposed. By this way, an organic functional layer was formed.

Finally, aluminum was deposited on the electron injection layer, and a cathode having a layer thickness of 110 nm was disposed, whereby an organic EL element was prepared.

Furthermore, the side of the above-mentioned deposition surface was covered with an epoxy resin having a thickness of 300 μm to give a sealing material, the epoxy resin was further covered with an aluminum foil having a thickness of 12 μm to give a protective film, and curing was conducted. All of the operations so far were conducted in a glove box (under an atmosphere of a high purity nitrogen gas with a purity of 99.999% or more) under a nitrogen atmosphere, without allowing the element to contact with the air.

A pattern mask and an ultraviolet absorption filter (manufactured by Isuzu Glass, Ltd.) were disposed on the surface opposite to the side of the resin substrate on which the above-mentioned respective layers had been disposed, and subjected to tight-bonding under a reduced pressure in this disposition state, and irradiated from the side of the resin substrate with ultraviolet ray for 3 hours by using a UV tester (SUV-W151 manufactured by Iwasaki Electric Co., Ltd.: 100 mW/cm$^2$) to conduct patterning.

The pattern mask was disposed so that the surface area ratio of the ultraviolet ray-irradiated region to the non-ultraviolet ray-irradiated region became approximately 1:1, and a cross pattern with a width of 0.25 mm was disposed on the ultraviolet-irradiated region.

The ultraviolet absorption filter used had a light transmittance in the entire region at the wavelength regions of 320 nm or less of 50% or less (cut wavelength: 320 nm). By this way, the organic EL element 101 was prepared. In the following explanation, it is deemed that the ultraviolet absorption filter had a light transmittance in the entire region at wavelengths that are equal to or less than a wavelength indicated as a cut wavelength of 50% or less.

<Preparation of Organic EL Elements 102 to 105 Each Having Light Emitting Pattern>

Organic EL elements 102 to 105 were prepared in a similar manner, except that the cut wavelength (transmittance 50%) of the ultraviolet absorption filter was changed to 340 nm, 350 nm, 370 nm and 380 nm, respectively, as shown in Table 1, in the preparation of organic EL element 101.

<Preparation of Organic EL Element 106 Having Light Emitting Pattern>

An organic EL element 106 was prepared in a similar manner, except that irradiation with ultraviolet ray was conducted without using an ultraviolet absorption filter in the preparation of the organic EL element 101.

<Preparation of Organic EL Element 107 Having Light Emitting Pattern>

Patterning was conducted on a substrate on which ITO (Indium Tin Oxide; indium tin oxide) had been formed into a film at a thickness of 150 nm as an anode on a transparent glass substrate of 50 mm×50 mm having a thickness of 0.7 mm and a refractive index of 1.63, and the substrate was subjected to ultrasonic washing with isopropyl alcohol, dried with a dry nitrogen gas, and subjected to UV ozone washing for 5 minutes. An organic functional layer, a cathode, a sealing material and a protective film are disposed on this glass substrate in a similar manner to that in the preparation of the organic EL element 101.

Furthermore, this element was irradiated with ultraviolet ray in a similar manner to that in the preparation of the organic EL element 101, except that an ultraviolet absorption filter was not used, whereby the organic EL element 107 was disposed.

<Preparation of Organic EL Element 108 Having Light Emitting Pattern>

An organic functional layer was disposed in a similar manner to that for the organic EL element 101 on a glass substrate that had been treated in a similar manner to that for the organic EL element 107. The element was irradiated with ultraviolet ray (100 mW/cm$^2$) from the side of the organic functional layer for 0.5 h in the state that the element was installed under a nitrogen atmosphere and a pattern mask was disposed on the organic functional layer. The pattern mask was similar to that used in the preparation of the organic EL element 101.

A cathode, a sealing material and a protective film were disposed on the element after the ultraviolet irradiation in a similar manner to that in the preparation of the organic EL element 101, whereby an organic EL element 108 was disposed.

<Evaluation of Organic EL Element 101 to 108>

Organic EL elements 101 to 108 prepared as above were evaluated as follows. The evaluation results are shown in Table 1.

(1) Evaluation of Discoloration of Resin Substrate

In the resin substrates of the respective organic EL elements as prepared, the chromaticity b in the ultraviolet-irradiated part and the chromaticity b in the non-ultraviolet ray-irradiated part were measured, and the difference Δb (chromaticity difference) was obtained. The chromaticities were measured by using a type U-3300 Hitachi recording spectrometer (manufactured by Hitachi High-Technologies, Corporation). A chromaticity difference Δb larger than 1.0 indicates that discoloration is recognized by visual observation.

(2) Evaluation of Residual Luminance

The prepared respective organic EL elements were each driven at an electrical current at which the luminance of the non-ultraviolet ray-irradiated part became 500 cd/m$^2$, and the ratio of the luminance of the ultraviolet ray-irradiated part (cd/m$^2$) to the luminance of the non-ultraviolet ray-irradiated part (cd/m$^2$) was obtained as a residual luminance (%). The luminances were measured by using CA2000 (manufactured by Konica Minolta, Inc.). A smaller residual luminance indicates a higher degree of deterioration of the organic functional layer in the ultraviolet irradiated part.

(3) 0.25 mm Width Reproducibility

The prepared respective organic EL elements were each driven at an electrical current at which the luminance of the ultraviolet non-irradiated part became 500 cd/m$^2$, and the width (mm) of the cross shape of the ultraviolet non-irradiated part was measured. A measured width closer to 0.25 mm, which is the width of the pattern mask, indicates that the non-light-emitting region was formed with a fine accuracy by irradiation with ultraviolet ray.

TABLE 1

| Element No. | Substrate | Cut wavelength (nm) | Irradiation time (h) | Direction of irradiation | Chromaticity difference Δb | Residual luminance in irradiated part (%) | 0.25 mm width reproducibility (mm) | Notes |
|---|---|---|---|---|---|---|---|---|
| 101 | PET | 320 | 3.0 | Side of substrate | 1.80 | 1.2 | 0.24 | Comparative Example |
| 102 | PET | 340 | 3.0 | Side of substrate | 0.60 | 1.4 | 0.24 | Present invention |
| 103 | PET | 350 | 3.0 | Side of substrate | 0.20 | 1.6 | 0.25 | Present invention |
| 104 | PET | 370 | 3.0 | Side of substrate | 0.04 | 18.0 | 0.23 | Present invention |
| 105 | PET | 380 | 3.0 | Side of substrate | 0.01 | 20.0 | 0.24 | Present invention |
| 106 | PET | — | 3.0 | Side of substrate | 4.50 | 0.9 | 0.25 | Comparative Example |
| 107 | Glass | — | 3.0 | Side of substrate | — | 0.8 | 0.18 | Comparative Example |
| 108 | Glass | — | 0.5 | Side of organic functional layer | — | 35.0 | 0.24 | Comparative Example |

(4) Summary

It is understood that, in the case when the element was irradiated with ultraviolet ray having a cut wavelength of 320 nm, i.e., being free from wavelength components at 320 nm or less (organic EL element 101), the residual luminance was sufficiently low at the ultraviolet-irradiated part, and a non-light-emitting region was formed with a fine accuracy with respect to the width of the mask, but the discoloration of the resin substrate was generated.

Furthermore, in the case of an element using a glass substrate, in which the element was irradiated with ultraviolet ray from the side of the glass substrate (organic EL element 107), the residual luminance was sufficiently low in the ultraviolet ray-irradiated part, but the accuracy of the formation of the non-light-emitting region with respect to the width of the mask was low. On the other hand, in the case of an element using a glass substrate, in which the element was irradiated with ultraviolet ray from the side of the organic functional layer (organic EL element 108), the residual luminance was low at the ultraviolet irradiated part, and thus the non-light-emitting region was able to be formed with a fine accuracy with respect to the width of the mask. However, since it is necessary to conduct the ultraviolet irradiation in the state that the element is disposed under a nitrogen atmosphere as mentioned above, the cost is high, and the step of irradiating with ultraviolet ray cannot be easily conducted.

In the cases when the element was irradiated with ultraviolet ray having a cut wavelength of 340 nm or more, i.e., being free from the wavelength components at 340 nm or less, (organic EL elements 102 to 105), the discoloration of the resin substrate was not generated at the ultraviolet ray-irradiated part, and the residual luminance was sufficient low, and thus a non-light-emitting region was able to be formed with a fine accuracy with respect to the width of the mask.

Accordingly, it was shown that a non-light-emitting region can be formed without generation of the discoloration of the resin substrate by irradiating with ultraviolet ray being free from the wavelength components at 340 nm or less.

Example 2

Preparation of Organic EL Element 201 Having Light Emitting Pattern

An organic EL element 201 was prepared in a similar manner, except that the resin substrate was changed from PET to PEN and the ultraviolet ray irradiation time was set to 6 hours in the preparation of the organic EL element 101.

<Preparation of Organic EL Elements 202 to 205 Having Light Emitting Pattern>

Organic EL elements 202 to 205 were prepared in a similar manner, except that the cut wavelength (transmittance 50%) of the ultraviolet absorption filter was changed to 340 nm, 350 nm, 370 nm and 380 nm, respectively, as shown in Table 2, in the preparation of organic EL element 201.

<Preparation of Organic EL Element 206 Having Light Emitting Pattern>

An organic EL element 206 was prepared in a similar manner, except that irradiation with ultraviolet ray was conducted without using an ultraviolet absorption filter in the preparation of the organic EL element 201.

<Preparation of Organic EL Element 207 Having Light Emitting Pattern>

An organic EL element 207 was prepared in a similar manner, except that the resin substrate was changed from PEN to PC in the preparation of the organic EL element 201.

<Preparation of Organic EL Elements 208 to 211 Having Light Emitting Pattern>

Organic EL elements 208 to 211 were prepared in a similar manner, except that the cut wavelength (transmittance 50%) of the ultraviolet absorption filter was changed to 340 nm, 350 nm, 370 nm and 380 nm, respectively, as shown in Table 2, in the preparation of organic EL element 207.

<Preparation of Organic EL Element 212 Having Light Emitting Pattern>

An organic EL element 212 was prepared in a similar manner, except that irradiation with ultraviolet ray was conducted without using an ultraviolet absorption filter in the preparation of the organic EL element 207.

<Preparation of Organic EL Element 213 Having Light Emitting Pattern>

An organic EL element 213 was prepared in a similar manner, except that the resin substrate was changed from PEN to an acrylic resin in the preparation of the organic EL element 201.

<Preparation of Organic EL Elements 214 to 217 Having Light Emitting Pattern>

Organic EL elements 214 to 217 were prepared in a similar manner, except that the cut wavelength (transmittance 50%) of the ultraviolet absorption filter was changed to 340 nm, 350 nm, 370 nm and 380 nm, respectively, as shown in Table 2, in the preparation of organic EL element 213.

<Preparation of Organic EL Element 218 Having Light Emitting Pattern>

An organic EL element 218 was prepared in a similar manner, except that patterning was conducted by irradiating the element with ultraviolet ray without using an ultraviolet absorption filter in the preparation of the organic EL element 213.

<Evaluation of Organic EL Elements 201 to 218>

For the organic EL elements 201 to 218 prepared as above, evaluation of the discoloration of the resin substrate and evaluation of the residual luminance were conducted in similar manners to those of Example 1. The results of the evaluation are shown in Table 2.

TABLE 2

| Element No. | Resin substrate | Cut wavelength (nm) | Irradiation time (h) | Chromaticity difference Δb | Residual luminance in irradiated part (%) | Notes |
|---|---|---|---|---|---|---|
| 201 | PEN | 320 | 6 | 3.20 | 37 | Comparative Example |
| 202 | PEN | 340 | 6 | 0.60 | 40 | Present invention |
| 203 | PEN | 350 | 6 | 0.20 | 42 | Present invention |
| 204 | PEN | 370 | 6 | 0.05 | 55 | Present invention |
| 205 | PEN | 380 | 6 | 0.01 | 60 | Present invention |
| 206 | PEN | — | 6 | 7.50 | 35 | Comparative Example |
| 207 | PC | 320 | 6 | 3.60 | 40 | Comparative Example |
| 208 | PC | 340 | 6 | 0.90 | 44 | Present invention |
| 209 | PC | 350 | 6 | 0.60 | 45 | Present invention |
| 210 | PC | 370 | 6 | 0.20 | 58 | Present invention |
| 211 | PC | 380 | 6 | 0.10 | 63 | Present invention |
| 212 | PC | — | 6 | 8.00 | 37 | Comparative Example |
| 213 | Acrylic | 320 | 6 | 3.40 | 40 | Comparative Example |
| 214 | Acrylic | 340 | 6 | 0.70 | 44 | Present invention |
| 215 | Acrylic | 350 | 6 | 0.50 | 49 | Present invention |
| 216 | Acrylic | 370 | 6 | 0.10 | 56 | Present invention |
| 217 | Acrylic | 380 | 6 | 0.05 | 62 | Present invention |
| 218 | Acrylic | — | 6 | 7.70 | 36 | Comparative Example |

As is shown in Table 2, in the cases when the element was irradiated with ultraviolet ray having a cut wavelength of 340 nm, i.e., being free from wavelength components at 340 nm or less, the discoloration of the resin substrate did not occur in the ultraviolet ray-irradiated part, and the residual luminance was able to be decreased, in the resin substrate of either material.

Therefore, it was shown that a non-light-emitting region can be formed by irradiating the organic functional layer with light being free from wavelength components at 340 nm or less, without causing the discoloration of the resin substrate.

Example 3

Preparation of Organic EL Element 301 Having Light Emitting Pattern

Nitrogen-containing compound N-1 was formed into a film at a thickness of 25 nm on a PET transparent resin substrate having a gas barrier layer on which polysilazane and an organic layer (stress relaxation layer) had been stacked and having a thickness of 125 μm in a vacuum deposition apparatus, and silver was formed into a film as an anode at a thickness of 10 nm by using a mask.

A hole injection layer, a hole transport layer, a blue light emitting layer, a first medium layer, a green light emitting layer, a second medium layer and a red light emitting layer were disposed on this resin substrate in a similar manner to the preparation of the organic EL element 101.

Furthermore, nitrogen-containing compound N-1 was deposited to form a film at a thickness of 20 nm on a red light emitting layer, and silver was deposited thereon to dispose a cathode having a layer thickness of 10 nm.

Furthermore, the side of the above-mentioned deposited surface was covered with an epoxy resin having a thickness of 300 μm to give a sealing material, and further covered with a transparent PET having a gas barrier layer on which polysilazane and an organic layer (stress relaxation layer) had been stacked and having a thickness of 125 μm to give a protective film, and curing was conducted. The transparent PET was disposed so that the gas barrier layer faced the epoxy resin. All of the operations so far were conducted in a glove box (under an atmosphere of a high purity nitrogen gas with a purity of 99.999% or more) under a nitrogen atmosphere, without allowing the element to contact with the air.

This element was irradiated with ultraviolet ray in a similar manner to that of the preparation of the organic EL element 101, whereby a both-surface light emitting type organic EL element 301 was prepared.

<Preparation of Organic EL Elements 302 to 305 Having Light Emitting Pattern>

Both-surface light emitting type organic EL elements 302 to 305 were prepared in a similar manner, except that the cut wavelength (transmittance 50%) of the ultraviolet absorption filter was changed to 340 nm, 350 nm, 370 nm and 380 nm, respectively, as shown in Table 3, in the preparation of the organic EL element 301.

<Preparation of Organic EL Element 306 Having Light Emitting Pattern>

A both-surface light emitting type organic EL element 306 was prepared in a similar manner, except that the element was irradiated with ultraviolet ray without using an ultraviolet absorption filter in the preparation of the organic EL element 301.

<Evaluation of Organic EL Elements 301 to 306>

For the organic EL elements 301 to 306 prepared as above, evaluation of the discoloration of the resin substrate and evaluation of the residual luminance were conducted in similar manners to those of Example 1. The results of the evaluation are shown in Table 3.

nm or less, the discoloration of the resin substrate did not occur in the ultraviolet irradiated part, and the residual luminance was able to be decreased.

Accordingly, it was shown that a non-light-emitting region can be formed by irradiating the organic functional layer with light being free from wavelength components at 340 nm or less, without causing the discoloration of the resin substrate, also in the cases when a both-surface light emitting type organic EL element is produced.

INDUSTRIAL APPLICABILITY

As mentioned above, the present invention is suitable for providing a method for producing an organic electroluminescent element, by which a non-light-emitting region can be formed without any accompanying discoloration of a resin substrate.

| | Reference Signs List |
|---|---|
| 1 | First electrode |
| 1a | Primer layer |
| 1b | Electrode layer |
| 3 | Organic functional layer |
| 3a | Hole injection layer |
| 3b | Hole transport layer |
| 3c | Light emitting layer |
| 3d | Electron transport layer |
| 3e | Electron injection layer |
| 5a | Second electrode |
| 10 | Organic EL element |
| 13 | Transparent substrate |
| 13a | Light extraction surface |
| 15 | Assistant electrode |
| 16 | Extraction electrode |
| 17 | Sealing material |
| 19 | Adhesive |
| h | Emitted light |

The invention claimed is:

1. A method for producing an organic electroluminescent element, comprising:

stacking a first electrode, an organic functional layer and a second electrode on a resin substrate, and irradiating a prescribed region of the organic functional layer with light that has passed through an optical filter having a light transmittance of 50% or less in a whole

TABLE 3

| Element No. | Resin substrate | Cut wavelength (nm) | Irradiation time (h) | Chromaticity difference Δb | Residual luminance in irradiated part (%) | Notes |
|---|---|---|---|---|---|---|
| 301 | PET | 320 | 3 | 1.70 | 1.3 | Comparative Example |
| 302 | PET | 340 | 3 | 0.60 | 1.5 | Present invention |
| 303 | PET | 350 | 3 | 0.10 | 2.0 | Present invention |
| 304 | PET | 370 | 3 | 0.04 | 21.0 | Present invention |
| 305 | PET | 380 | 3 | 0.01 | 25.0 | Present invention |
| 306 | PET | — | 3 | 4.50 | 1.1 | Comparative Example |

As is shown in Table 3, in the cases when the element was irradiated with ultraviolet ray having a cut wavelength of 340 nm, i.e., being free from wavelength components at 340 region of a wavelength range of 340 nm or less, or laser light having a wavelength of more than 340 nm and 400 nm or less.

2. The method for producing an organic electroluminescent element according to claim 1, further comprising sealing the organic functional layer after the stacking, wherein the light irradiation step is conducted after the sealing.

* * * * *